(12) United States Patent
Yamaura et al.

(10) Patent No.: US 10,581,339 B2
(45) Date of Patent: Mar. 3, 2020

(54) POWER CONVERSION SYSTEM AND ASSEMBLING METHOD

(71) Applicant: DENSO CORPORATION, Kariya, Aichi-pref. (JP)

(72) Inventors: Kodai Yamaura, Kariya (JP); Hiroki Umeda, Toyota (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/410,543

(22) Filed: May 13, 2019

(65) Prior Publication Data
US 2019/0348907 A1 Nov. 14, 2019

(30) Foreign Application Priority Data
May 11, 2018 (JP) .................................. 2018-092343

(51) Int. Cl.
*H02M 7/00* (2006.01)
*H02M 7/537* (2006.01)
*H05K 7/20* (2006.01)
*H02M 1/32* (2007.01)
*H02M 3/158* (2006.01)

(52) U.S. Cl.
CPC .......... *H02M 7/003* (2013.01); *H02M 7/537* (2013.01); *H05K 7/2029* (2013.01); *H02M 1/32* (2013.01); *H02M 3/158* (2013.01); *H02M 2001/327* (2013.01)

(58) Field of Classification Search
CPC .......... H02M 1/14; H02M 1/32; H02M 7/003; H02M 7/537; H02M 7/106; H02M 3/158; H02M 2001/327; H05K 7/2029
See application file for complete search history.

(56) References Cited

U.S. PATENT DOCUMENTS

| 7,719,838 B2* | 5/2010 | Nakajima | H02M 7/003 361/699 |
| 2009/0002974 A1* | 1/2009 | Yahata | B60L 15/20 361/820 |

(Continued)

FOREIGN PATENT DOCUMENTS

| JP | 2015-073401 A | 4/2015 |
| JP | 2016-100913 A | 5/2016 |

(Continued)

*Primary Examiner* — Yusef A Ahmed
(74) *Attorney, Agent, or Firm* — Oliff PLC

(57) ABSTRACT

A power conversion system at least includes a filter capacitor, a DC-DC converter, a smoothing capacitor, a housing and a refrigerant flow channel. The refrigerant flow channel is disposed between the housing and a flow channel cover. The refrigerant flow channel includes a converter facing portion at least partially facing the DC-DC converter. The filter capacitor at least partially overlaps with the DC-DC converter when viewed in a first direction from an opposite side of the refrigerant flow channel to the converter facing portion. The smoothing capacitor does not overlap with the DC-DC converter when viewed in the first direction and partially overlaps with the DC-DC converter when viewed in a second direction. At least two fastening sections fasten the flow channel cover to the housing and do not overlap with the smoothing capacitor when viewed in the first direction.

7 Claims, 12 Drawing Sheets

(56) References Cited

U.S. PATENT DOCUMENTS

| | | | | |
|---|---|---|---|---|
| 2011/0211980 A1* | 9/2011 | Shibuya | ............... | F04B 39/121 |
| | | | | 417/410.1 |
| 2012/0218716 A1* | 8/2012 | Asakura | ............. | H01L 23/4006 |
| | | | | 361/717 |
| 2013/0070502 A1* | 3/2013 | Suzuki | ................ | H02M 7/003 |
| | | | | 363/131 |
| 2014/0198450 A1* | 7/2014 | Baba | .................. | H05K 9/0007 |
| | | | | 361/689 |
| 2014/0313671 A1* | 10/2014 | Sugita | ............... | H05K 7/20927 |
| | | | | 361/700 |
| 2015/0295532 A1* | 10/2015 | Sakai | ................... | F04B 49/065 |
| | | | | 318/472 |
| 2015/0305188 A1* | 10/2015 | Maeda | ................ | H05K 7/1432 |
| | | | | 361/728 |
| 2016/0294301 A1* | 10/2016 | Yokoyama | ........... | H02M 7/003 |
| 2017/0040907 A1* | 2/2017 | Goto | ....................... | H02M 3/28 |
| 2017/0094842 A1* | 3/2017 | Standing | ........... | H05K 7/20927 |
| 2017/0181333 A1* | 6/2017 | Kosaka | ............. | H05K 7/20254 |
| 2018/0281605 A1* | 10/2018 | Sawazaki | .......... | H01L 23/4012 |
| 2018/0358903 A1* | 12/2018 | Takahashi | .......... | H01L 23/4012 |
| 2019/0110355 A1* | 4/2019 | Sato | ...................... | H05K 1/181 |
| 2019/0122958 A1* | 4/2019 | Uneme | ............... | H01L 23/3672 |
| 2019/0173394 A1* | 6/2019 | Miura | .................... | B60L 50/51 |
| 2019/0174647 A1* | 6/2019 | Umeda | ................ | H05K 7/1432 |

FOREIGN PATENT DOCUMENTS

| | | |
|---|---|---|
| JP | 2018-137918 A | 8/2018 |
| JP | 2018-142661 A | 9/2018 |
| JP | 2018-186633 A | 11/2018 |
| JP | 2018-207664 A | 12/2018 |
| JP | 2019-062077 A | 4/2019 |
| JP | 2019-062651 A | 4/2019 |
| JP | 2019-092329 A | 6/2019 |
| JP | 2019-103280 A | 6/2019 |
| JP | 2019-103282 A | 6/2019 |
| JP | 2019-106755 A | 6/2019 |
| JP | 2019-129225 A | 8/2019 |
| JP | 2019-146409 A | 8/2019 |
| JP | 2019-187098 A | 10/2019 |
| JP | 2019-193470 A | 10/2019 |

* cited by examiner

POWER CONVERSION SYSTEM AND ASSEMBLING METHOD

CROSS-REFERENCE TO RELATED APPLICATION

This patent application is based on and claims priority to Japanese Patent Application No. 2018-092343, filed on May 11, 2018 in the Japan Patent Office, the entire disclosure of which is hereby incorporated by reference herein.

BACKGROUND

Technical Field

Embodiments of the present disclosure relate to a power conversion system and a power conversion system assembling method.

Related Art

A power conversion system is generally composed of an inverter and a so-called DC-DC converter (i.e., a direct current to direct current converter), and sometimes includes a filter capacitor and a smoothing capacitor as well as discussed in Japanese Patent Application Publication No. 2016-100913 (JP-2016-100913-A), for example. The filter capacitor is connected to a direct current power supply to absorb ripples of an output from the direct current power supply. The smoothing capacitor smooths a DC voltage boosted by a booster. A refrigerant flow channel is also included in a housing of the power conversion system to face the DC-DC converter so as to either prevent or reduce temperature increase in the DC-DC converter.

However, in recent years, as the power conversion system increasingly generates a high output to satisfy a demand therefor, the smoothing capacitor is sometimes necessarily upsized, and accordingly, the power conversion system is expected to be compact by effectively utilizing a space in the housing.

For, example, when a filter capacitor and a DC-DC converter are commonly connected to the direct current power supply, a positional relation between multiple parts needs to be regulated by taking a positional relation between the filter capacitor and the DC-DC converter into account. Also, a position at which the refrigerant flow channel is disposed is taken into account.

The present invention is made in view of the above-described problem and an object thereof is to provide a novel power conversion system effectively downsized.

SUMMARY

Accordingly, one aspect of the present disclosure provides a novel power conversion system that includes; a filter capacitor and a DC-DC converter each connected to a direct current power supply (e.g., a battery BAT as an eternal power supply); a smoothing capacitor connected to a power conversion circuit; and a housing to accommodate the filter capacitor, the DC-DC converter and the smoothing capacitor. The power conversion system also includes a refrigerant flow channel to cool the DC-DC converter. The refrigerant flow channel is disposed between the housing and a flow channel cover fixed to the housing. The refrigerant flow channel includes a converter facing portion at least partially facing the DC-DC converter. The filter capacitor is disposed on an opposite side of the DC-DC converter to the converter facing portion and at least a portion of the filter capacitor overlaps with the DC-DC converter when viewed in a Z direction, in which the converter facing portion faces the DC-DC converter. The smoothing capacitor is arranged not to overlap with the DC-DC converter when viewed in the Z direction, and to partially overlap with the DC-DC converter when viewed in a X direction perpendicular to the Z direction. Further, multiple fastening sections 12 are positioned to fasten the flow channel cover to the housing without overlapping with the smoothing capacitor when viewed in the Z direction. Accordingly, since the filter capacitor at least partially overlaps with the DC-DC converter when viewed in the Z direction in the power conversion system, the DC-DC converter and the filter capacitor can be closely disposed to each other while commonly connected to the direct current power supply BAT. As a result, connection wires (hereinafter, sometimes referred to as input wires) connecting the direct current power supply, the DC-DC converter and the filter capacitor can be shortened while saving space for wiring of the input wires and reducing inductances of the input wires as well.

Further, since the smoothing capacitor 4 is positioned not to overlap with the DC-DC converter 3 when viewed in the Z direction, and to at least partially overlap with the DC-DC converter 3 when viewed in the X direction, the smoothing capacitor 4 can effectively utilize a space overlapping with the DC-DC converter 3 when viewed in the X direction. Hence, upsizing of the power conversion system due to upsizing of the smoothing capacitor can be either suppressed or reduced in the X direction. Also, since fastening sections that fasten the flow channel cover to the housing do not overlap with the smoothing capacitor when viewed in the Z direction, a space for the smoothing capacitor can preferably be secured in the Z direction without upsizing the housing. Hence, the power conversion system can be readily downsized in the Z direction. Accordingly, as described heretofore, according to one aspect of the present disclosure, a power conversion system can easily be downsized as a whole.

BRIEF DESCRIPTION OF THE DRAWINGS

A more complete appreciation of the present disclosure and many of the attendant advantages of the present disclosure will be more readily obtained as it becomes better understood by reference to the following detailed description when considered in connection with the accompanying drawings, wherein.

DETAILED DESCRIPTION

Figure 1:
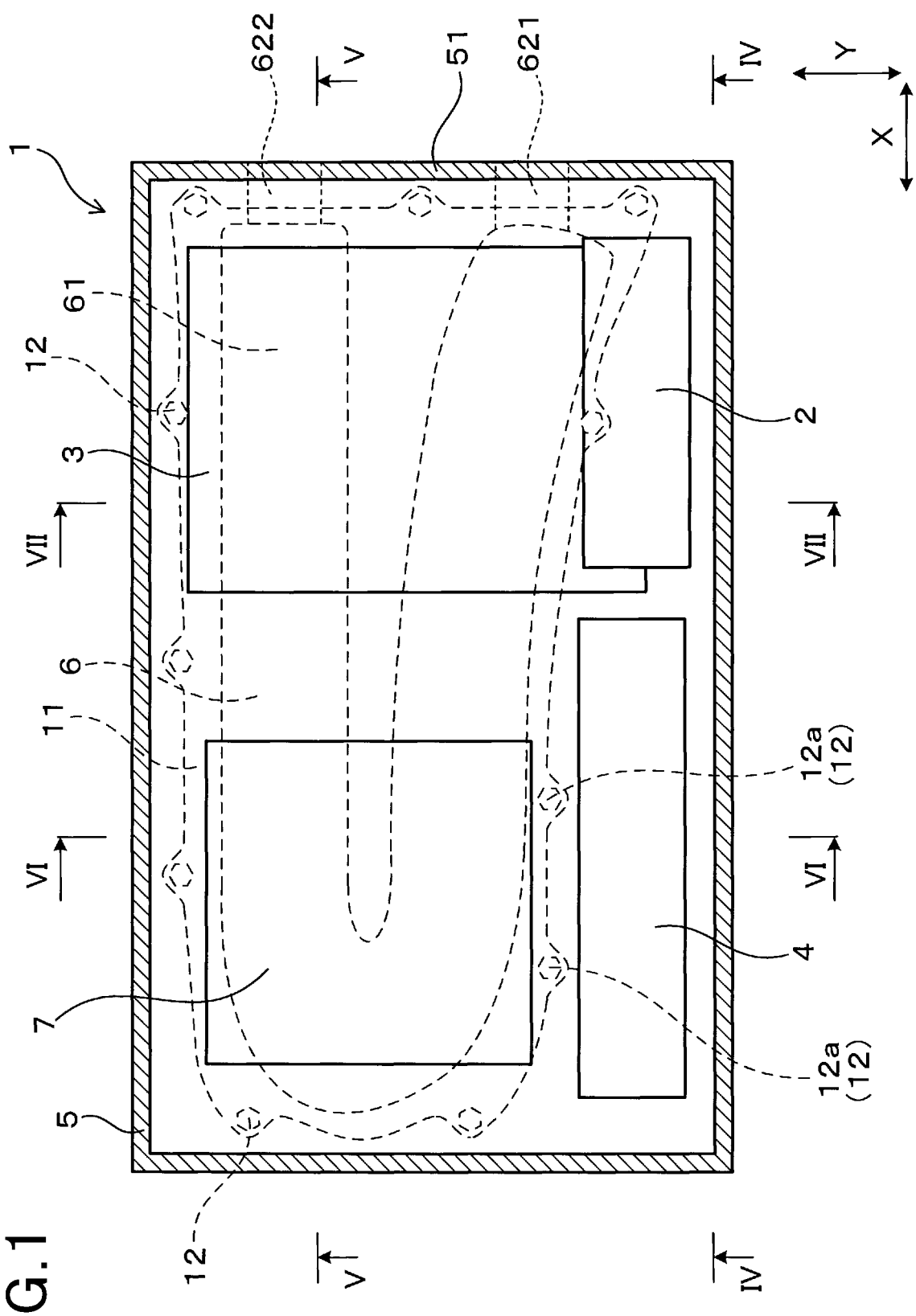
FIG. 1 is a cross-sectional view taken along a prescribed horizontal line illustrating an exemplary power conversion system according to a first embodiment of the present disclosure.
Figure 2:
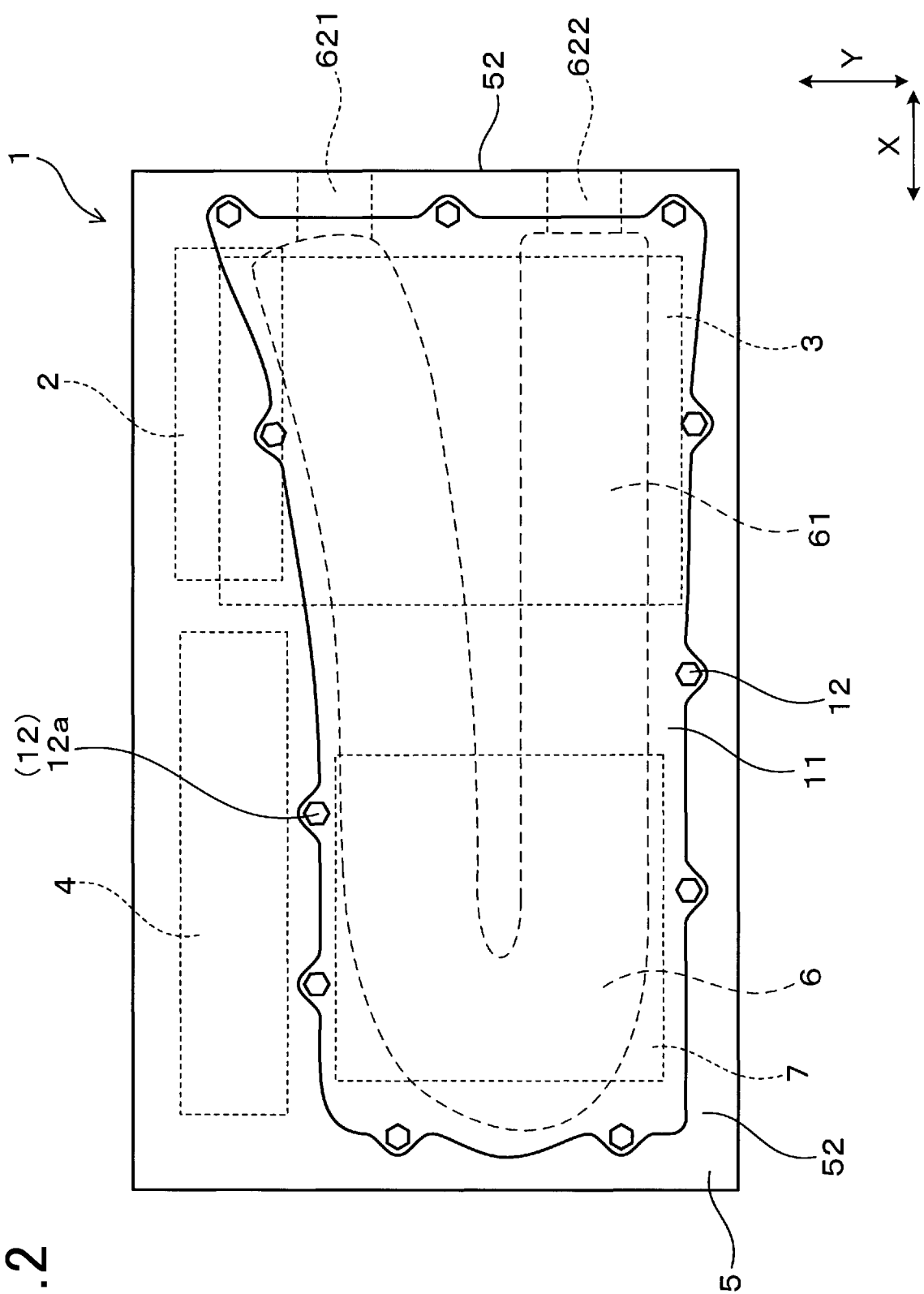
FIG. 2 is a bottom view illustrating of the power conversion system according to the first embodiment of the present disclosure.

Referring now to the drawings, wherein like reference numerals designate identical or corresponding parts throughout the several views thereof, and in particular to FIGS. 1 to 8, an exemplary power conversion system of a first embodiment of the present disclosure is described. As illustrated in FIGS. 1 and 2, the power conversion system of this embodiment of the present disclosure includes a filter capacitor 2, a DC-DC converter 3, a smoothing capacitor 4, a housing 5, and a refrigerant flow channel 6.

Figure 7:
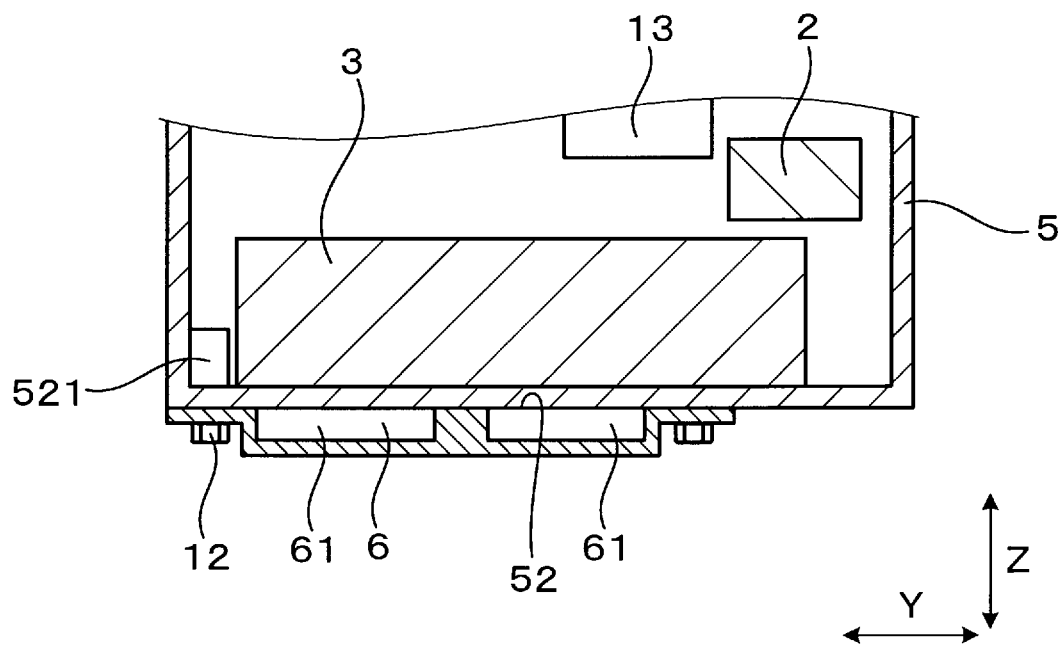
FIG. 7 is a cross-sectional view taken along a line indicated in FIG. 1 according to the first embodiment of the present disclosure.
Figure 8:
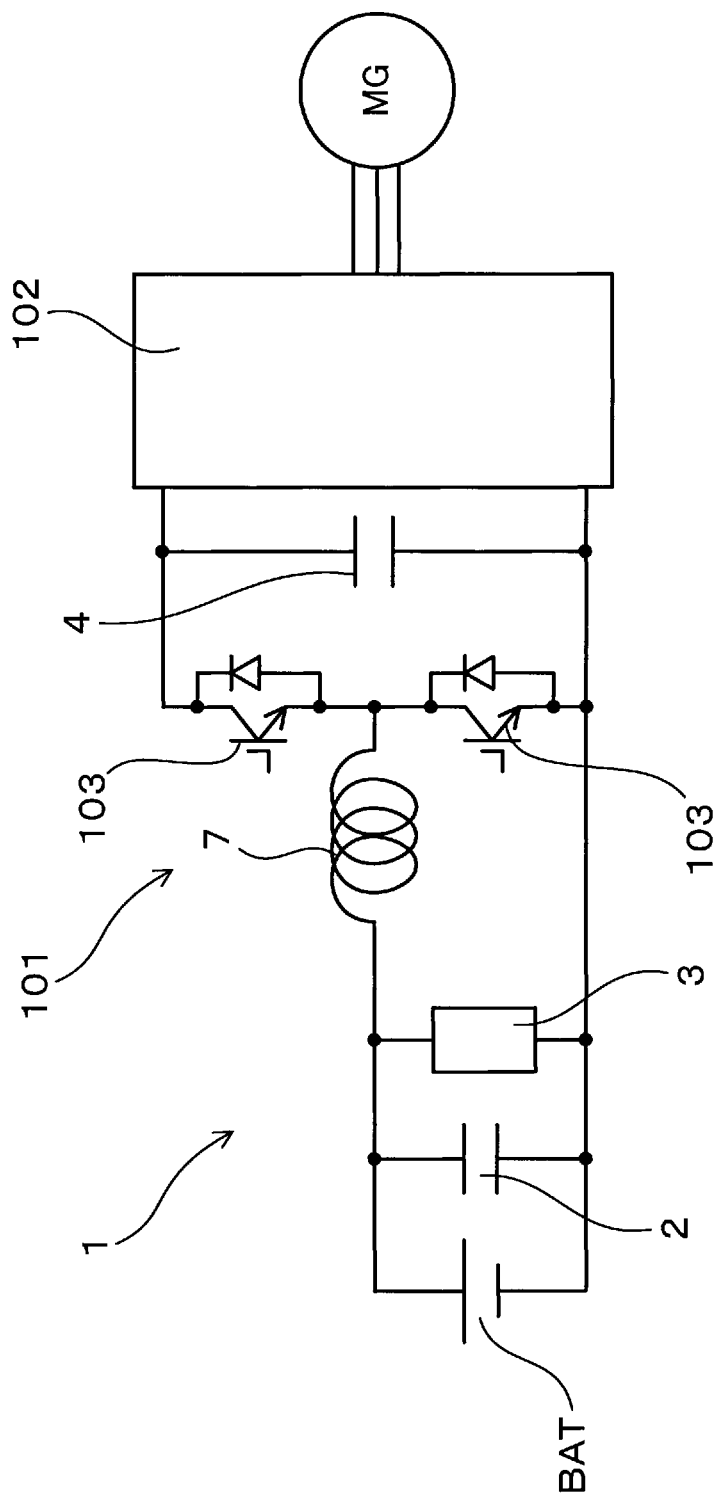
FIG. 8 is a circuit diagram illustrating an exemplary circuit of the power conversion system according to the first embodiment of the present disclosure.

As illustrated in FIG. 8, the filter capacitor 2 and the DC-DC converter 3 are connected to the direct current power supply BAT. The smoothing capacitor 4 is connected to a power conversion circuit (i.e., an inverter 102). As illustrated in FIGS. 1 to 7, the housing 5 accommodates the filter capacitor 2, the DC-DC converter 3 and the smoothing capacitor 4. A refrigerant flow channel 6 is provided to cool the DC-DC converter 3.

Figure 5:
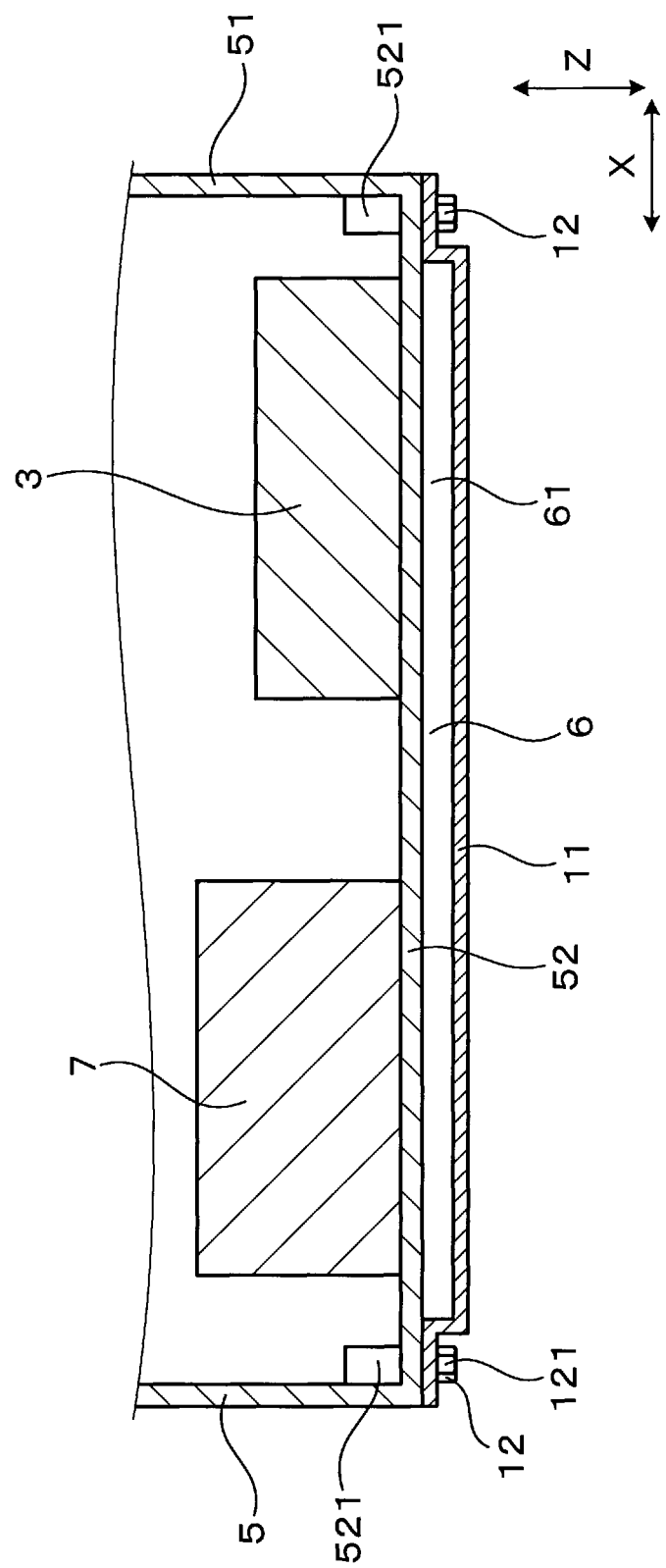
FIG. 5 is also a cross-sectional view taken along a line V-V indicated in FIG. 1 according to the first embodiment of the present disclosure.
Figure 6:
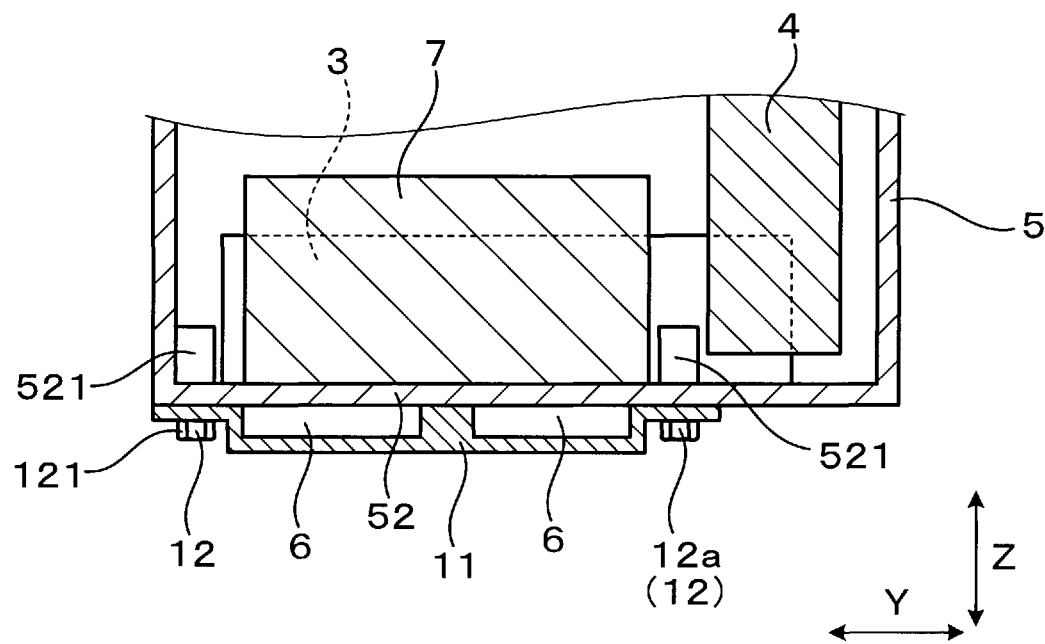
FIG. 6 is a cross-sectional view taken along a line VI-VI indicated in FIG. 1 according to the first embodiment of the present disclosure.

As illustrated in FIGS. 5 to 7, the refrigerant flow channel 6 is arranged between a housing 5 and a flow channel cover 11 fixed to the housing 5. As illustrated in FIGS. 1, 2, 5 and 7, the refrigerant flow channel 6 at least includes a converter facing portion 61 that at least partially faces the DC-DC converter 3.

A direction, in which the converter facing portion 61 and the DC-DC converter 3 oppose each other, is premised as a Z direction. As illustrated in FIGS. 1 to 4 and 7, at least a portion of the filter capacitor 2 is disposed on an opposite side of the DC-DC converter 3 to the converter facing portion 61 and overlaps with the DC-DC converter 3 when viewed in the Z direction. Although it is not illustrated, the DC-DC converter 3 includes an input filter section and an output filter section or the like beside a body accommodating a transformer or the like, for example. Further, only these devices (i.e., the input filter section or the output filter section) can partially overlap with the filter capacitor 2 when viewed in the Z direction. Further, the refrigerant flow channel 6 is preferably disposed overlapping with the body of the DC-DC converter 3 when viewed in the Z direction.

Figure 3:
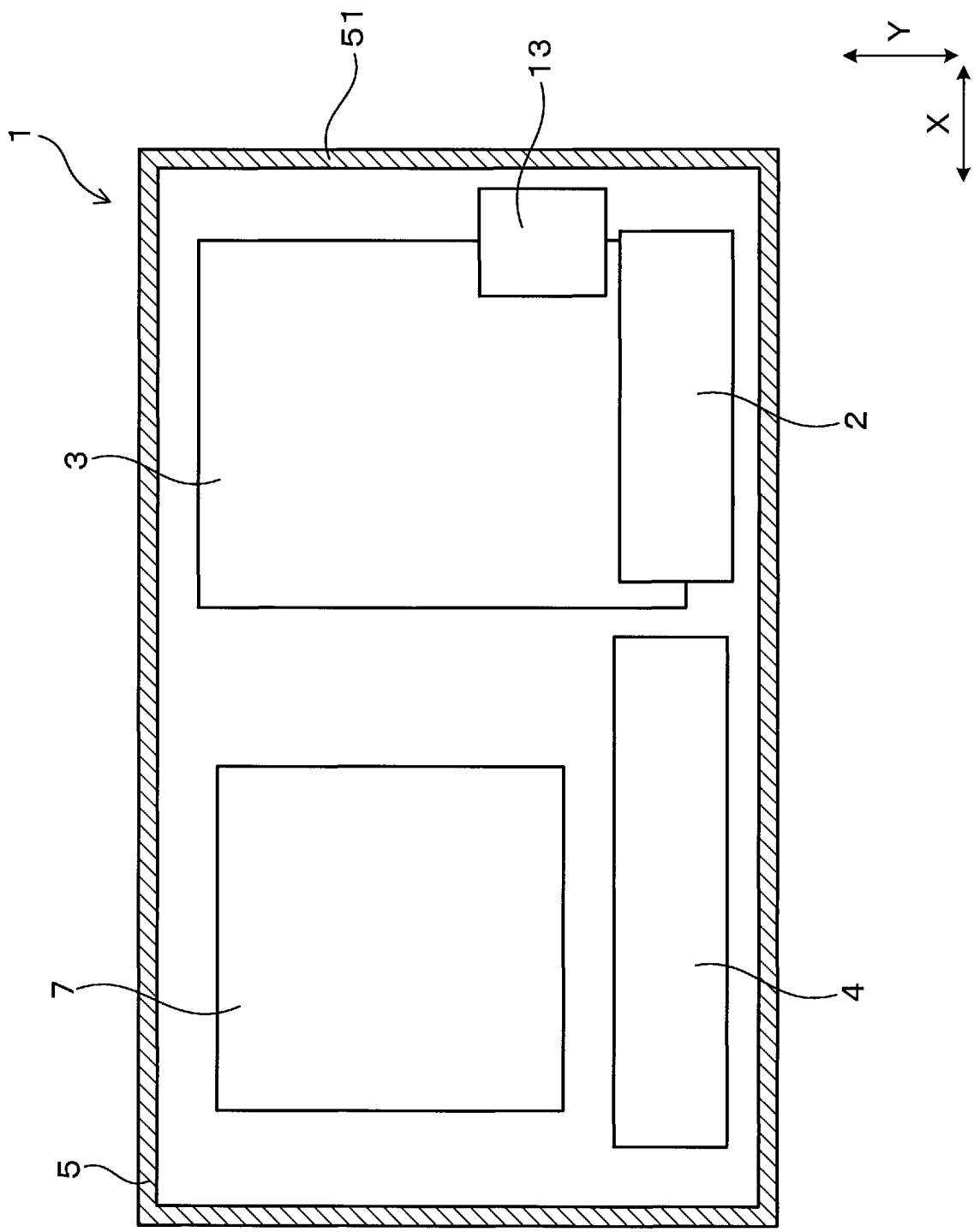
FIG. 3 is a cross-sectional view a bottom illustrating the power conversion system excluding a refrigerant flow channel according to the first embodiment of the present disclosure.

As illustrated in FIG. 3, the smoothing capacitor 4 is disposed not to overlap with the DC-DC converter 3 when viewed in the Z direction, and as illustrated in FIG. 6, it is disposed to partially overlap with the DC-DC converter 3 when viewed in the X direction perpendicular to the Z direction.

As illustrated in FIGS. 1 and 2, a fastening section 12 that fastens the flow channel cover 11 to the housing 5 is positioned not to overlap with the smoothing capacitor 4 when viewed in the Z direction. Also, in this embodiment of the present disclosure, at least one of the multiple fastening sections 12 is positioned between the refrigerant flow channel 6 and the smoothing capacitor 4 when viewed in the Z direction. That is, out of more than one fastening section 12 illustrated in FIGS. 1 and 2, a fastening section 12a is positioned between the refrigerant flow channel 6 and the smoothing capacitor 4 when viewed in the Z direction.

As illustrated in FIG. 8, the power conversion system 1 of this embodiment of the present disclosure is disposed therebetween the direct current power supply BAT and a revolving electric motor MG driven by a three-phase alternating current and is connected to these devices. The power conversion system 1 is configured to convert from a direct current power to an alternating current power vice versa. The power conversion system 1 includes a boosting unit 101 to boost a voltage of the direct current power supply BAT 101 and an inverter 102 to convert a high-voltage direct current power boosted by the boosting unit 101 into an alternating current power. The power conversion system 1 also includes the DC-DC converter 3 as described above and is configured to be able to convert a voltage of a direct current power.

The power conversion system 1 is mounted on an electric car and a hybrid car, for example, and is enabled to drive a revolving electric motor MG by using an alternating current power converted by the inverter 102. The power conversion system 1 is also enabled to step down the voltage of the direct current power supply BAT by using the DC-DC converter 3 and to supply a result of stepping down operation to a battery used in an alternator (not illustrated).

The smoothing capacitor 4 is disposed between the voltage booster 101 and the inverter 102, and is connected to the voltage booster 101 and the inverter 102. The smoothing capacitor 4 smooths a voltage of direct current power supplied to the inverter 102. The boosting unit 101 is composed of a reactor 7 and multiple switching elements 103. Although it is not illustrated, the inverter 102 also includes multiple switching elements and constitutes a power conversion circuit.

Figure 4:
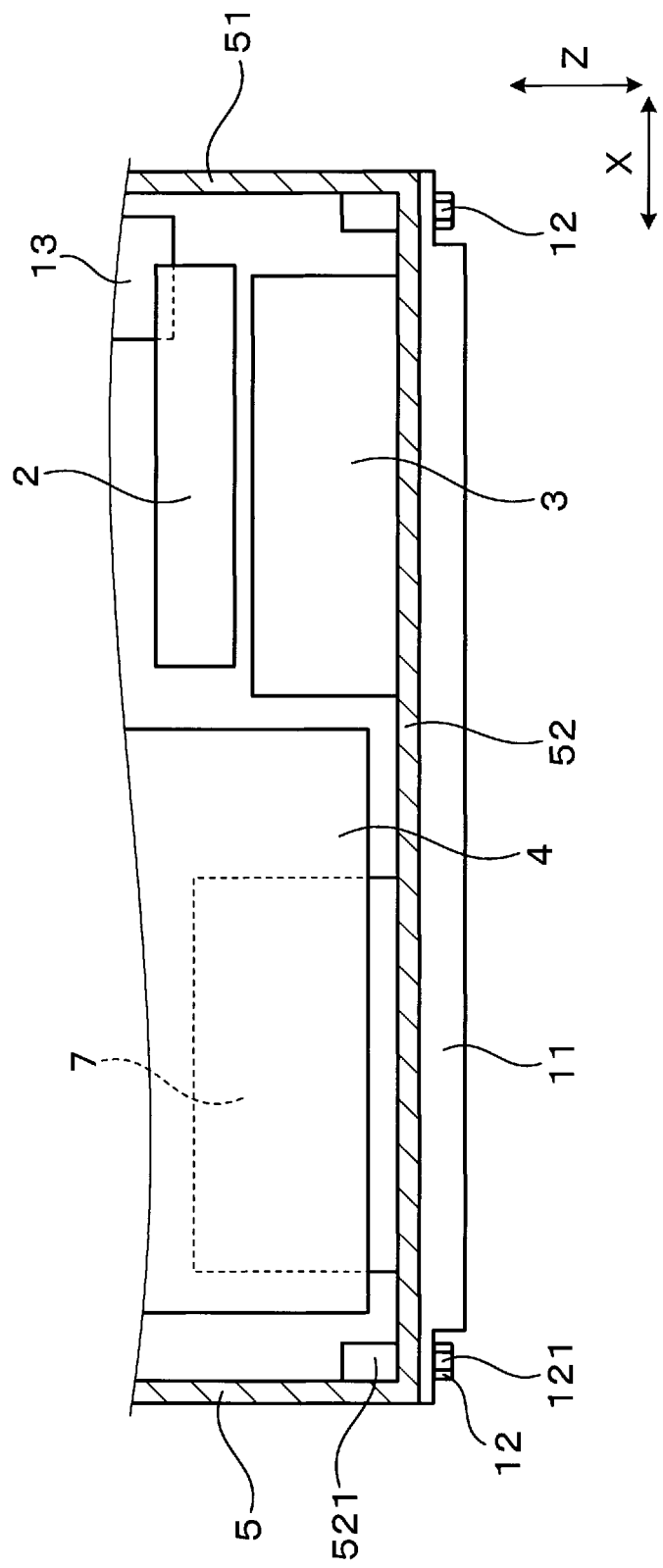
FIG. 4 is a cross-sectional view taken along a line IV-IV indicated in FIG. 1 according to the first embodiment of the present disclosure.

As illustrated in FIGS. 1 to 3, the reactor 7 is housed in the housing 5 together with the filter capacitor 2, the DC-DC converter 3, and the smoothing capacitor 4. As illustrated in FIG. 6, the reactor 7 is disposed to partially overlap with the DC-DC converter 3 when viewed in the X direction. At the same time, as illustrated in FIG. 4, the reactor 7 is positioned to partially overlap with the smoothing capacitor 4 when viewed in a Y direction. Here, the Y direction is perpendicular to both of the directions X and Z. Further, a part of more than one fastening section 12 (i.e. a fastening section 12a) is positioned between the reactor 7 and the smoothing capacitor 4 when viewed in the Z direction.

In this embodiment of the present disclosure, the housing 5 includes almost a rectangular solid shape. Specifically, as illustrated in FIGS. 1 to 3, when viewed in the Z direction, the housing 5 is a longer in the X-direction than the Y direction. In addition, as shown, the filter capacitor 2 and the DC-DC converter 3 are positioned on one side (i.e., a right side) of the housing 5 when viewed in the X direction. Herein below, one side of the housing 5, in which the filter capacitor 2 and the DC-DC converter 3 are placed when viewed in the X direction, is sometimes referred to as a front side. By contrast, an opposite side to the one side is referred to as a rear side when viewed in the X direction. Further, a side, in which the refrigerant flow channel 6 is disposed opposing the DC-DC converter 3 when viewed in the Z direction, is sometimes referred to as a lower side. By contrast, an opposite side to the side is referred to as an upper side when viewed in the Z direction. However, the directions of the power conversion system 1 and arrangement of the interior devices are not particularly limited to these front and rear sides and the upper and lower sides.

Further, as illustrated in FIGS. 3 and 4, an input terminal table 13 is disposed in the housing 5. The input terminal table 13 is provided to electrically connect input terminals (not illustrated) extended from the direct current power supply BAT with the filter capacitor 2 and the DC-DC converter 3. Specifically, the input terminal table 13 is configured to connect input terminals on the side of the direct current power supply BAT with input wires connected to the filter capacitor 2 and the DC-DC converter on the input terminal table 13, respectively.

The input terminal table 13 is installed in the housing 5 near the front edge (i.e., a front wall 51) of the housing 5. Further, as illustrated in FIG. 3, the input terminal table 13 is positioned to partially overlap with a front edge of the DC-DC converter 3 when viewed in the Z direction.

Further, as illustrated in FIG. 1, the smoothing capacitor 4 is disposed apart from the refrigerant flow channel 6 when viewed in the Z direction. That is, the smoothing capacitor 4 does not overlap with the refrigerant flow channel 6 when viewed in the Z direction. Further, as illustrated in FIGS. 4 and 6, a lower surface of the smoothing capacitor 4 is separated from a bottom wall 52 of the housing 5. Further, as illustrated in FIGS. 5 and 6, both of the DC-DC converter 3 and the reactor 7 contact an upper surface of the bottom wall 52 of the housing 5.

Further, as illustrated in FIGS. 1 and 2, the refrigerant flow channel 6 includes a refrigerant introduction port 621 and a refrigerant exhaust port 622 at respective positions closer to the DC-DC converter 3 than the reactor 7 when viewed in the Z direction.

Specifically, the refrigerant introduction port 621 and the refrigerant exhaust port 622 are located near the front edge of the housing 5. The refrigerant flow channel 6 has a substantially U-shaped form when viewed in the Z direction. That is, a refrigerant introduced from the refrigerant introduction port 621 firstly heads backward to the rear side of the housing 5 along the refrigerant flow channel 6. Then, the refrigerant turns back near the rear edge of the housing 5 and heads toward the front side thereof. The refrigerant is ultimately discharged from the refrigerant exhaust port 622 located in the front side of the housing 5. However, the refrigerant can be supplied in a reverse direction along the refrigerant flow channel 6 to the above-described direction by switching the refrigerant introduction port 621 and the refrigerant exhaust port 622 as well.

The refrigerant flow channel 6 faces both of the DC-DC converter 3 and the reactor 7 via the bottom wall 52 of the housing 5. Hence, since the refrigerant flows through the refrigerant flow channel 6 as described above, both of the DC-DC converter 3 and the reactor 7 are cooled.

Further, the refrigerant flow channel 6 is disposed to partially overlap with the filter capacitor 2 when viewed in the Z direction. That is, in this embodiment of the present disclosure, the refrigerant flow channel 6 near the refrigerant introduction port 621 partially overlaps with the filter capacitor 2 when viewed in the Z direction. However, the refrigerant flow channel 6 can be configured not to partially overlap with the filter capacitor 2 when viewed in the Z direction as well.

Further, as illustrated in FIGS. 5 to 7, the refrigerant flow channel 6 is positioned between the bottom wall 52 of the housing 5 and the flow channel cover 11 fixed to the lower surface of the bottom wall 52. Although the drawing illustrates an example in which a pair of recesses constituting the refrigerant flow channel 6 is provided in the flow channel cover 11 one or more grooves can be formed in the lower surface of the bottom wall 52. The flow channel cover 11 is fastened to the bottom wall 52 at multiple fastening sections 12. In this embodiment of the present disclosure, each of the fastening section 12 is configured by a bolt 121. Each of the bolts 121 is disposed with its tip heading upward.

The multiple fastening sections 12 of the flow channel cover 11 are positioned on a periphery of the refrigerant flow channel 6. Specifically, as illustrated in FIGS. 4 to 7, the housing 5 includes multiple bosses 521, in which multiple female screws are respectively disposed to be screwed to the multiple bolts 121 and thereby constituting the fastening sections 12. Each of the bosses 521 protrudes upwardly from the bottom wall 52 into the housing 5 accordingly. Specifically, when viewed in the Z direction, the fastening sections 12 are disposed at positions of the respective bosses 521.

Further, although some of the multiple fastening sections 12 are positioned to overlap with the DC-DC converter 3 when viewed in the Z direction, the boss sections 521 are arranged not to interference with components of the DC-DC converter 3. That is, since the DC-DC converter 3 is composed of two or more components, and all of lower surfaces does not (i.e., some of lower surfaces do) actually contact the bottom wall 52 as illustrated in FIG. 3 and applicable drawings, the fastening sections 12 (i.e., the bosses 521) are placed in spaces formed between the respective components.

Here, although the above-described inverter 102 or the like is also accommodated in the housing 5, description thereof is not repeated. Further, the housing 5 can be made of metal such as aluminum, etc., having excellent thermal conductivity. Further, the housing 5 can be configured by combining several members as well.

Now, exemplary advantages of one embodiment of the present disclosure are described herein below. In the above-described power conversion system 1, since the filter capacitor 2 at least partially overlaps with the DC-DC converter 3 when viewed in the Z direction, the filter capacitor 2 and the DC-DC converter 3 can be closely arranged while being commonly connected to the direct current power supply BAT. Hence, connection wires (i.e., input wires) connecting the direct current power supply BAT, the DC-DC converter 3 and the filter capacitor 2 with each other can be to shortened. As a result, an inductance of input wiring (i.e., the input wires) can be reduced while saving space for the input wiring.

Further, the smoothing capacitor 4 is positioned not to overlap with the DC-DC converter 3 when viewed in the Z direction, and to at least partially overlap with the DC-DC converter 3 when viewed in the X direction. Accordingly, a space overlapping with the DC-DC converter 3 when viewed in the X direction can be effectively utilized to dispose the smoothing capacitor 4 therein. As a result, upsizing of the power conversion system 1 due to a tendency of upsizing of the smoothing capacitor can be either suppressed or reduced.

Further, since all of the fastening sections 12 is positioned not overlap with the smoothing capacitor 4 when viewed in the Z direction, a wide installation space can be secured in the Z direction for the smoothing capacitor 4 without upsizing the housing 5. As a result, the power conversion system 1 can be readily downsized.

Further, since the smoothing capacitor 4 does not overlap with the refrigerant flow channel 6 when viewed in the Z direction, the fastening sections 12 can be easily placed not to overlap with the smoothing capacitor 4 when viewed in the Z direction. As a result, upsizing of the housing 5 due to a tendency of upsizing of the smoothing capacitor 4 can more readily be either suppressed or reduced.

Further, since the reactor 7 is arranged to partially overlap with the DC-DC converter 3 when viewed in the X direction and to partially overlap with the smoothing capacitor 4 when viewed in the Y direction, an interior space of the housing 5 can be effectively utilized. Hence, the power conversion system can easily be downsized again.

Further, since the refrigerant introduction port 621 of the refrigerant flow channel 6 is located closer to the DC-DC converter 3 than the reactor 7 when viewed in the Z direction, the DC-DC converter 3 can be effectively cooled down. That is, when it easily generates relatively a large amount of heat or the like, for example, the DC-DC converter 3 can effectively be cooled.

Hence, as described heretofore, according to the first embodiment of the present disclosure, an effectively downsized power conversion system can be provided.

Figure 9:
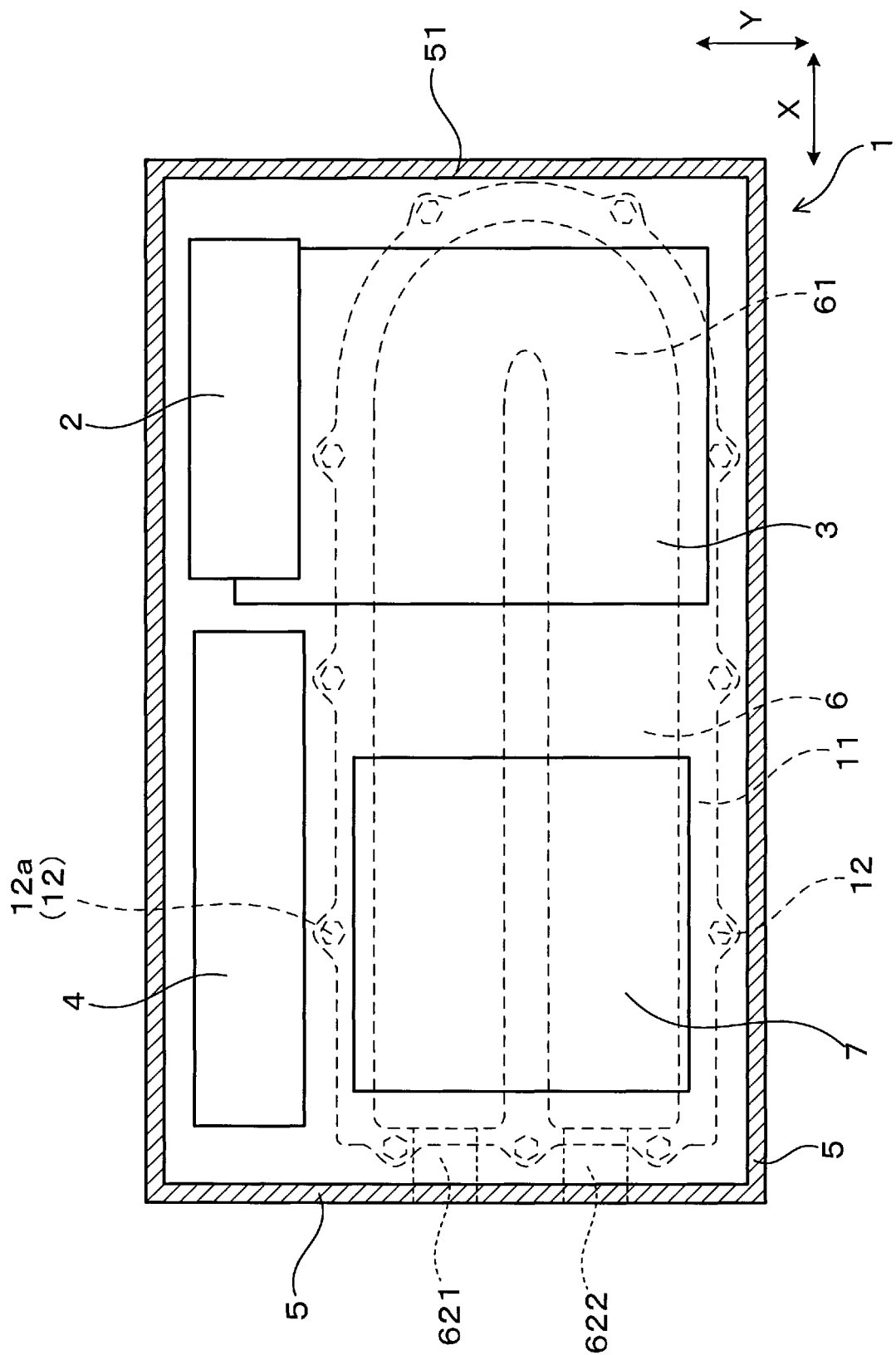
FIG. 9 is a cross-sectional view taken along a prescribed horizontal line illustrating an exemplary power conversion system according to a second embodiment of the present disclosure.

Now, a second embodiment of the present disclosure is described with reference to FIG. 9. As illustrated in FIG. 9, a refrigerant flow channel 6 included in the power conversion system 1 of this embodiment of the present disclosure includes the refrigerant introduction port 621 at a position closer to the reactor 7 than the DC-DC converter 3 when viewed in the Z direction. Specifically, in this embodiment of the present disclosure, the refrigerant introduction port 621 is disposed near the rear edge of the housing 5 when viewed in the X direction. The refrigerant exhaust port 622 is also disposed near the rear edge of the housing 5 when viewed in the X direction as well.

Further, in the refrigerant flow channel 6, a positional relation between the DC-DC converter 3 and the reactor 7 regarding the refrigerant introduction port 621 and the refrigerant exhaust port 622 is designed to be opposite to that in the first embodiment of the present disclosure when viewed in the X direction. However, the refrigerant flow channel 6 is disposed not to overlap with the filter capacitor 4 when viewed in the Z direction.

Remaining configurations of the power conversion system 1 of this embodiment of the present disclosure are the same as those of the first embodiment of the present disclosure. Here, the same reference numerals as used heretofore in the first embodiment of the present disclosure represent the same components or similar devices in the second and following embodiments of the present disclosure unless otherwise particularly described.

Hence, in this embodiment of the present disclosure, the reactor 7 can be effectively cooled easily. In addition, the DC-DC converter 3 may also be sufficiently cooled sometimes, if components thereof are preferably placed in relation to the refrigerant flow channel 6. That is, since the DC-DC converter 3 includes a relatively wide range of components, such as a transformer, a semiconductor device, a choke coil, a capacitor, etc., a layout of these components has a room to be improved. When such placement is available in the DC-DC converter 3 and the reactor 7 composed of a relatively few components is located facing an upstream of the refrigerant flow channel 6, the DC-DC converter 3 can easily be cooled as a whole. Besides, the same advantage may be obtained in the second embodiment of the present disclosure as in the first embodiment of the present disclosure.

Figure 10:
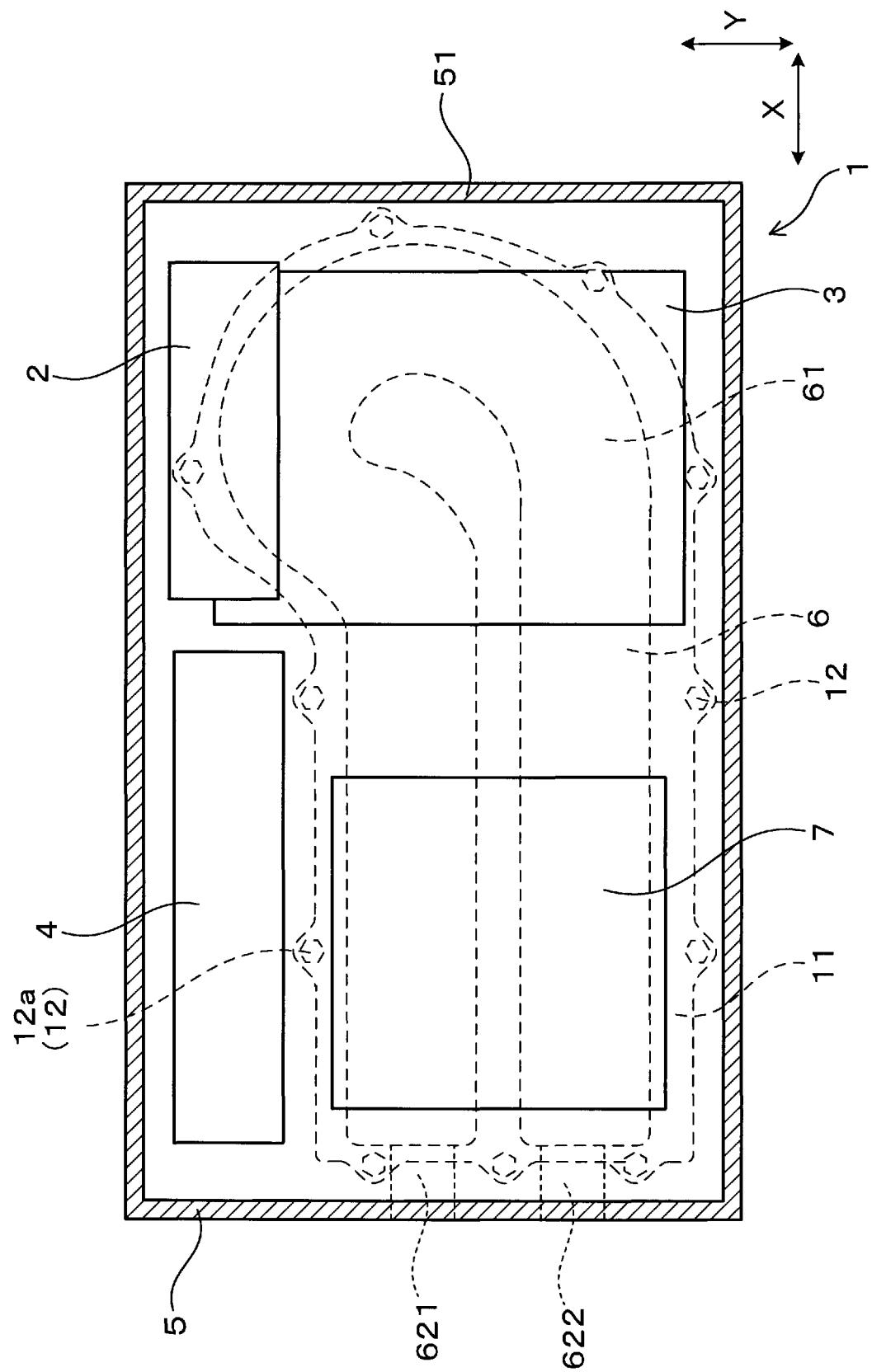
FIG. 10 is a cross-sectional view taken along a prescribed horizontal line illustrating an exemplary power conversion system according to a second embodiment of the present disclosure.

Further, as illustrated in FIG. 10, the refrigerant flow channel 6 may be disposed to partially overlap with the filter capacitor 2 when viewed in the Z direction as a modification of the above-described second embodiment of the present disclosure.

Figure 11:
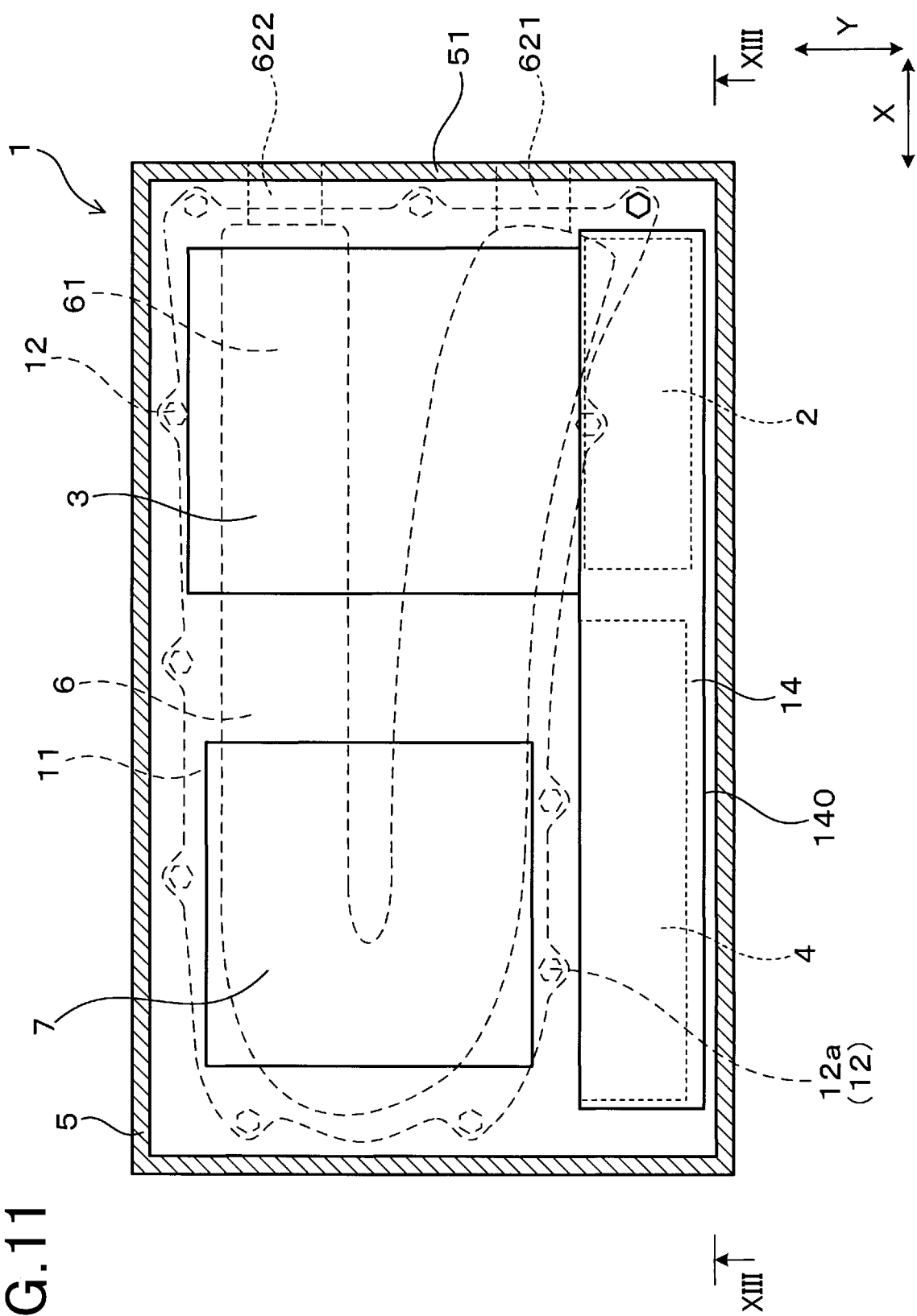
FIG. 11 is a cross-sectional view taken along a prescribed horizontal line illustrating an exemplary power conversion system according to a third embodiment of the present disclosure.
Figure 12:
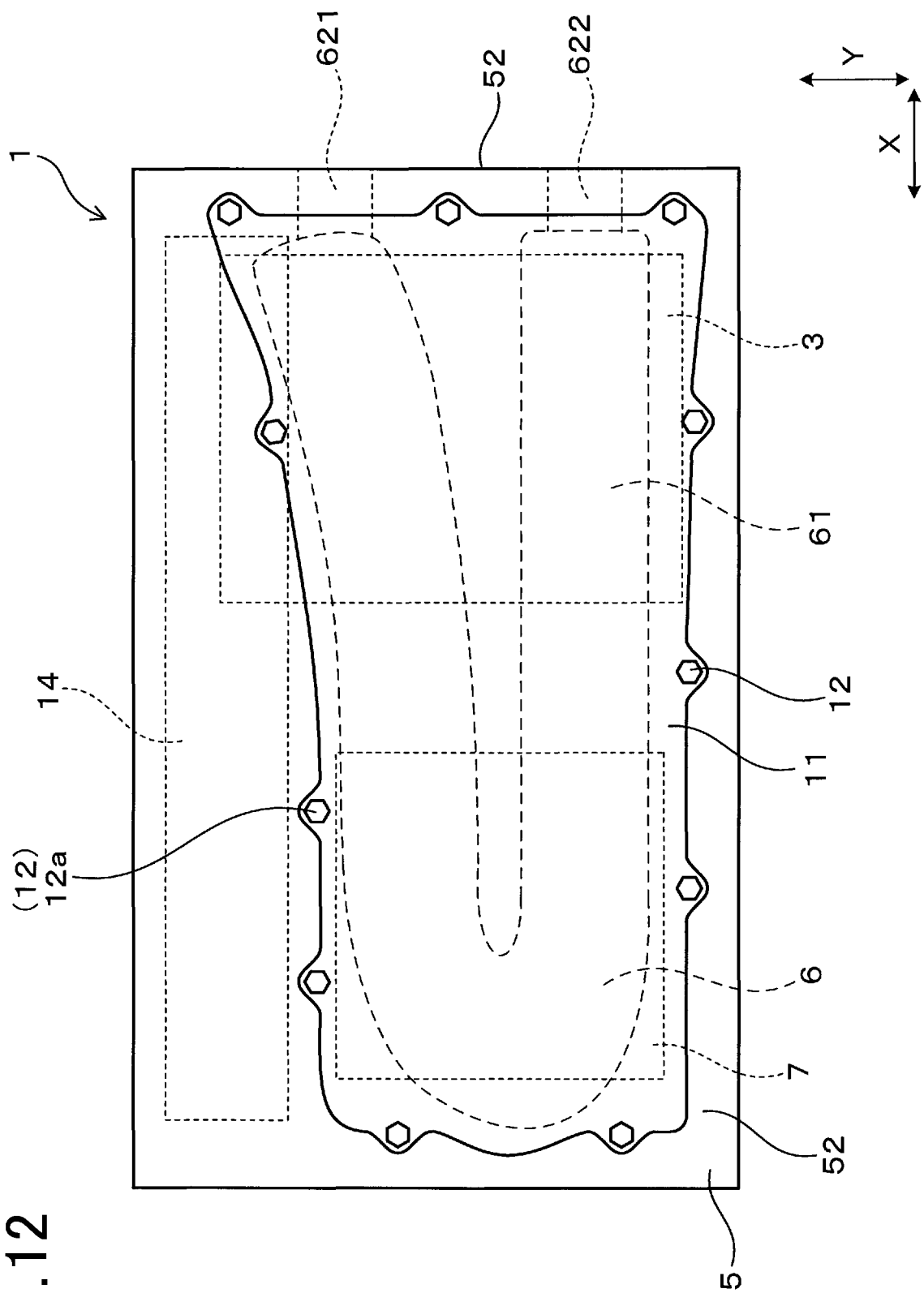
FIG. 12 is a bottom view illustrating of the power conversion system according, to the third embodiment of the present disclosure.
Figure 13:
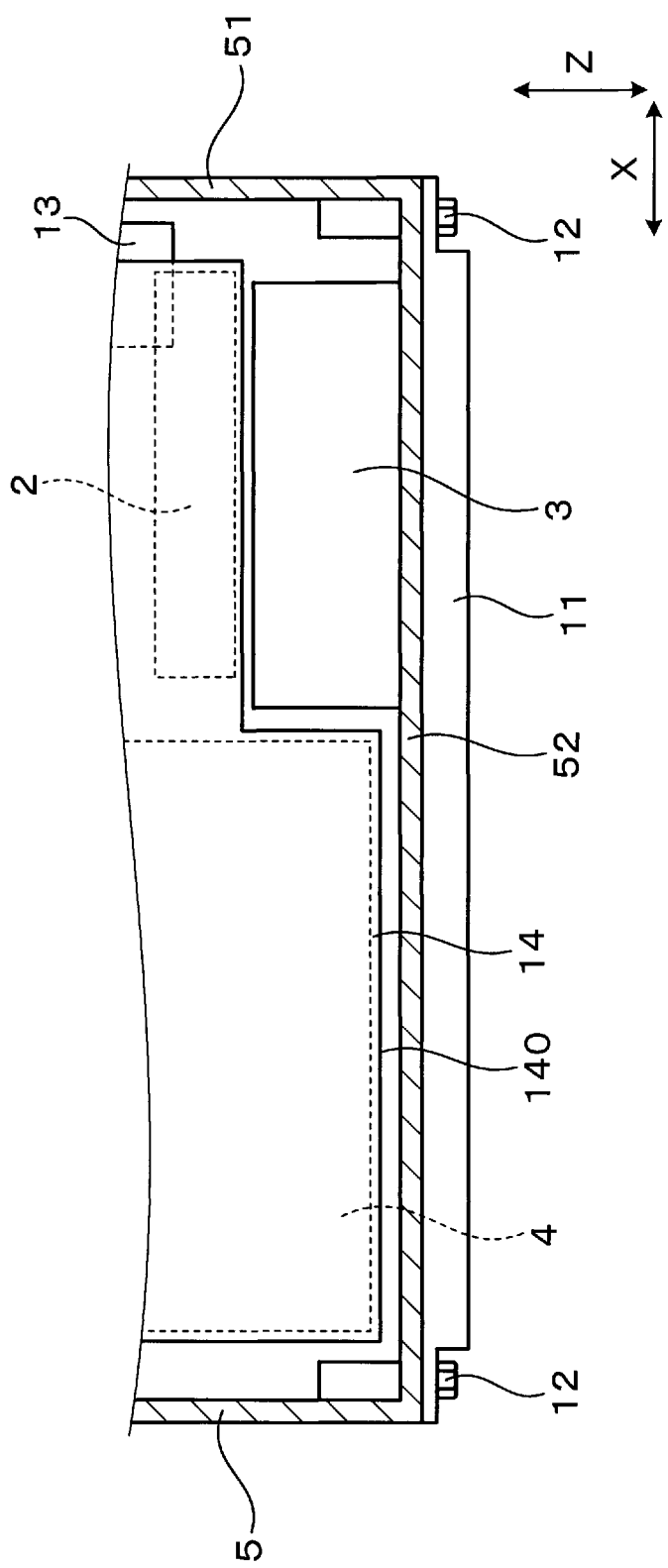
FIG. 13 is a cross-sectional view taken along a line indicated in FIG. 1 according to the third embodiment of the present disclosure.

Now, a third embodiment of the present disclosure is described with reference to FIGS. 11 to 13. As illustrated in FIGS. 11 to 13, this embodiment of the present disclosure employs a power conversion system 1 that includes a capacitor module 14 configured by integrating the filter capacitor 2 with the smoothing capacitor 4. Specifically, the capacitor module 14 includes a resin housing accommodating the smoothing capacitor 4 and the filter capacitor 2 therein, for example. The filter capacitor 2 and the smoothing capacitor 4 can be sealed with resin in the plastic housing 140 together with a part of a bus bar.

Sub a capacitor module 14 is placed in the housing 5 of the power conversion system 1 as illustrated in FIGS. 11 to 13. Further, a positional relation between each of the filter capacitor 2 and the smoothing capacitor 4 and each of the other components such as the DC-DC converter 3, the reactor 7, the refrigerant flow channel 5, etc., is equivalent to that in the first embodiment of the present disclosure.

As a result, as illustrated in FIG. 13, a section of the capacitor module 14, in which the smoothing capacitor 4 is placed protrudes downwardly from another section of the capacitor module 14, in which the filter capacitor 2 is placed, when viewed in the Y direction. Remaining configurations of this modification of the present disclosure are substantially the same as in the first embodiment of the present disclosure.

Hence, according to this embodiment and the modification of the present disclosure, the power conversion system 1 can easily be assembled. In addition, substantially the same advantage is obtained as in the first embodiment of the present disclosure.

Numerous additional modifications and variations of the present disclosure are possible in light of the above teachings. It is therefore to be understood that within the scope of the appended claims, the present disclosure may be executed otherwise than as specifically described herein. For example, the power conversion system is not limited to the above-described various embodiments and may be altered as appropriate. Similarly, the smoothing capacitor assembling method is not limited to the above-described various embodiments and may be altered as appropriate.

What is claimed is:

1. A power conversion system, comprising:
   a filter capacitor connected to a direct current power supply to absorb ripples in output from the direct current power supply, the direct current power supply acting as a battery;
   a DC-DC converter connected to the direct current power supply to apply DC-DC conversion to a voltage output from the direct current power supply;
   a smoothing capacitor to smooth a voltage of a direct current power supplied from the direct current power supply;

a housing to accommodate at least the filter capacitor, the DC-DC converter, and the smoothing capacitor;

a refrigerant flow channel to cool at least the DC-DC converter;

a flow channel cover to cover the refrigerant flow channel; and is at least two fastening sections to screw the flow channel cover to the housing, wherein the refrigerant flow channel is disposed between the housing and the flow channel cover fastened to the housing, the refrigerant flow channel including a converter facing portion at least partially facing the DC-DC converter, wherein the filter capacitor at least partially overlaps with the DC-DC converter on an opposite side of the DC-DC converter to the converter facing portion when viewed in a first direction, in which the converter facing portion of the refrigerant flow channel faces the DC-DC converter, wherein the smoothing capacitor is placed not to overlap with the DC-DC converter when viewed in the first direction, the smoothing capacitor partially overlapping with the DC-DC converter when viewed in a second direction perpendicular to the first direction, wherein the at least two fastening sections are positioned not to overlap with the smoothing capacitor when viewed in the first direction.

2. The power conversion system as claimed in claim 1, further comprising a power conversion circuit acting as an inverter to convert the direct current power to an alternating current power to drive a motor generator, wherein the power conversion circuit is connected to the smoothing capacitor.

3. The power conversion system as claimed in claim 1, wherein the smoothing capacitor is disposed not to overlap with the refrigerant flow channel when viewed in the first direction.

4. The power conversion system as claimed in claim 1, further comprising a reactor connected between the direct current power supply and the smoothing capacitor to boost a voltage output from the direct current power supply, wherein the reactor at least partially overlaps with both of the DC-DC converter when viewed in the second direction and the smoothing capacitor when viewed in a third direction perpendicular to both of the first and second directions.

5. The power conversion system as claimed in claim 4, wherein the refrigerant flow channel includes a refrigerant introduction port disposed closer to the DC-DC converter than the reactor when viewed in the first direction.

6. The power conversion system as claimed in claim 4, wherein the refrigerant flow channel includes a refrigerant introduction port disposed closer to the reactor than to the DC-DC converter when viewed in the first direction.

7. A method of assembling power conversion system, comprising the steps of:

connecting a filter capacitor to a direct current power supply acting as a battery to absorb a ripple of an output from the direct current power supply;

connecting a DC-DC converter to the direct current power supply to apply DC-DC conversion to a voltage output from the direct current power supply;

connecting a smoothing capacitor to a power conversion circuit that drives a motor generator to smooth a voltage of a direct current power supplied to the power conversion circuit;

connecting a reactor to the DC-DC converter at one side of the reactor and the smoothing capacitor at another side of the reactor to boost a voltage output from the direct current power supply;

accommodating at least the filter capacitor, the DC-DC converter, the smoothing capacitor and the reactor in a housing;

attaching a refrigerant flow channel to the housing to cool at least the DC-DC converter;

covering the refrigerant flow channel with a flow channel cover;

screwing the flow channel cover to the housing at at least two fastening sections while holding the refrigerant flow channel therebetween;

placing the refrigerant flow channel to face the DC-DC converter at at least a converter facing portion of the refrigerant flow channel;

positioning the filter capacitor on an opposite side of the DC-DC converter to the converter facing portion to at least partially overlap with the DC-DC converter when viewed in a first direction, in which the converter facing portion faces the DC-DC converter;

positioning the smoothing capacitor to overlap with the DC-DC converter when viewed in a second direction perpendicular to the first direction;

positioning the reactor to at least partially overlap with both of the DC-DC converter when viewed in the second direction and the smoothing capacitor when viewed in a third direction perpendicular to both of the first and second directions; and positioning the at least two fastening sections not to overlap with the smoothing capacitor when viewed in the first direction.

* * * * *